(12) United States Patent
Shin et al.

(10) Patent No.: US 6,939,759 B2
(45) Date of Patent: Sep. 6, 2005

(54) METHOD FOR MANUFACTURING CAPACITOR OF SEMICONDUCTOR DEVICE

(75) Inventors: Jong Han Shin, Seoul (KR); Sang Ick Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 62 days.

(21) Appl. No.: 10/721,093

(22) Filed: Nov. 26, 2003

(65) Prior Publication Data

US 2004/0266125 A1 Dec. 30, 2004

(30) Foreign Application Priority Data

Jun. 30, 2003 (KR) .................................. 10-2003-0043813

(51) Int. Cl.[7] .......................................... H01L 21/8242
(52) U.S. Cl. ....................................... 438/239; 257/301
(58) Field of Search ............................. 438/239, 244, 438/253, 254, 387, 396; 257/301, 303, 306

(56) References Cited

U.S. PATENT DOCUMENTS 5,940,703 A * 8/1999 Hong .......................... 438/254
6,274,899 B1 * 8/2001 Melnick et al. ............. 257/298

* cited by examiner

Primary Examiner—David Vu
(74) Attorney, Agent, or Firm—Heller Ehrman LLP

(57) ABSTRACT

The present invention discloses method for manufacturing capacitor of semiconductor device wherein a bonding layer is exposed via etch-back process without using a contact hole mask. In accordance with the method of the present invention, an interlayer insulating film, a bonding layer and a hard mask layer are sequentially formed on a semiconductor substrate. The hard mask layer, the bonding layer and the interlayer insulating film are then etched to form a storage electrode contact hole. The storage electrode contact hole is partially filled to form a storage electrode contact plug and the remaining portion is filled with a barrier metal layer pattern. The hard mask layer is then removed and a storage electrode contacting the barrier metal layer pattern is then formed on the bonding layer.

8 Claims, 4 Drawing Sheets

METHOD FOR MANUFACTURING CAPACITOR OF SEMICONDUCTOR DEVICE

BACKGROUND OF THE INVENTION

1. Field of the Invention

The present invention relates to method for manufacturing capacitor of semiconductor device, and in particular to an improved method for manufacturing capacitor wherein a bonding layer is exposed via etch-back process without using a mask for opening the bonding layer to prevent degradation of adhesive property due to decrease in the area of the exposed bonding layer and oxidation of barrier metal layer.

2. Description of the Background Art

Generally, capacitor in DRAM memory cell functions as storage for electric charge to store information. Therefore, the capacitor requires sufficient capacitance and high reliability in long term repeated use, and the dielectric film must have insulation property of low leakage current.

As the integration density of devices gets higher, area allocated for unit cell is reduced, resulting in difficulties in obtaining sufficient capacitance for capacitor. Therefore, in order to increase capacitance of capacitor, the height of capacitor must be increased and the process margin between adjacent cells be reduced.

In order to increase the capacitance of a capacitor, a method wherein a noble metal is used as a lower electrode and a film having a high dielectric constant is used as a dielectric film.

Although not shown, a conventional method for manufacturing capacitor of semiconductor device is as follows.

An interlayer insulating film having a storage electrode contact hole therein is formed on a semiconductor substrate. Next, a tungsten contact plug filling a predetermined depth of the storage electrode contact hole is formed therein. A TiN layer serving as a barrier metal layer is formed on the entire surface to fill the remaining portion of the storage electrode contact hole.

Thereafter, the TiN layer is planarized via chemical mechanical polishing ("CMP") to expose the interlayer insulating film so that the TiN layer remains only in the storage electrode contact hole. An alumina layer serving as a bonding layer is then formed on the entire surface. Next, the alumina layer is selectively etched via photolithography process to expose the TiN layer.

Next, a storage electrode consisting of a noble metal is formed on the bonding layer to contact the TiN layer.

In accordance with the conventional method for manufacturing capacitor of semiconductor device, a bonding layer is used to improve adhesive property of lower electrode consisting of a noble metal. However, a misalignment of opening occurs during the etching process of the bonding layer, which causes decrease of the thickness of the bonding layer and degradation of adhesive property. Moreover, oxygen atoms penetrate through the thin portion of the bonding layer to oxidize the barrier metal layer as shown in FIGS. 1 and 2, where FIGS. 1 and 2 are SEM photographs respectively showing oxidation of a TiN layer without and with a bonding layer in accordance with the conventional method for manufacturing capacitor of semiconductor device.

The oxidation of the barrier metal layer increase the contact resistance and the volume of the barrier metal layer, resulting in buckling at the interface of multiple layers constituting the lower electrode. When an oxide layer consisting of $SiO_2$ exists on the alumina layer, the oxidation of metal barrier layer also occurs.

SUMMARY OF THE INVENTION

Accordingly, it is an object of the present invention to provide a method for manufacturing capacitor of semiconductor device wherein a bonding layer is exposed via etch-back process without using a mask for opening the bonding layer to prevent degradation of adhesive property due to decrease in the area of the exposed bonding layer and oxidation of barrier metal layer.

In order to achieve the above-described object of the invention, there is provided a method for manufacturing capacitor of semiconductor device, comprising the steps of: forming an interlayer insulating film on a semiconductor substrate having a lower structure; sequentially forming a bonding layer and a hard mask layer on the interlayer insulating film; etching the hard mask layer, the bonding layer and the interlayer insulating film to form a storage electrode contact hole exposing a predetermined region of the semiconductor substrate for a storage electrode contact; forming a storage electrode contact plug filling a predetermined depth of the storage electrode contact hole; forming a barrier metal layer on the entire surface of the semiconductor substrate to fill up the storage electrode contact hole; planarizing the barrier metal layer using the hard mask layer as an etch stop layer to form a barrier metal layer pattern; removing the hard mask layer; and forming a storage electrode contacting the barrier metal layer pattern on the bonding layer.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for manufacturing capacitor of semiconductor device in accordance with a preferred embodiment of the present invention will now be described in detail with reference to the accompanying drawings.

Figure 1:
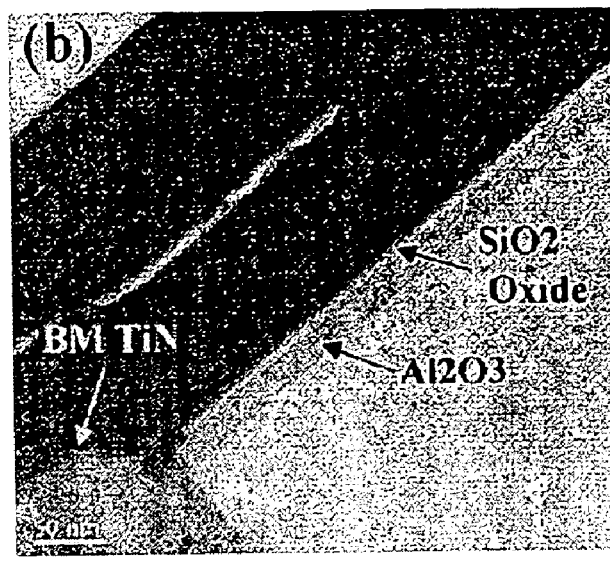
FIG. 1 is a SEM photograph showing oxidation of a TiN layer without a bonding layer in accordance with the conventional method for manufacturing capacitor of semiconductor device.
Figure 2:
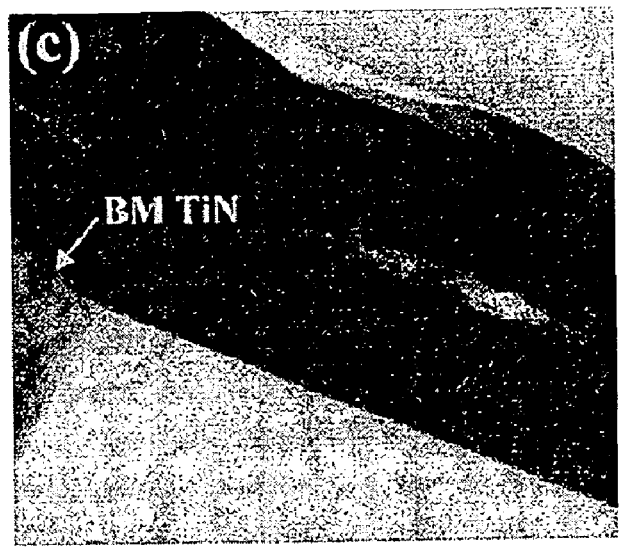
FIG. 2 is a SEM photograph showing oxidation of a portion of a TiN layer adjacent to a bonding layer in accordance with a conventional method for manufacturing capacitor of semiconductor device.
Figure 3A:
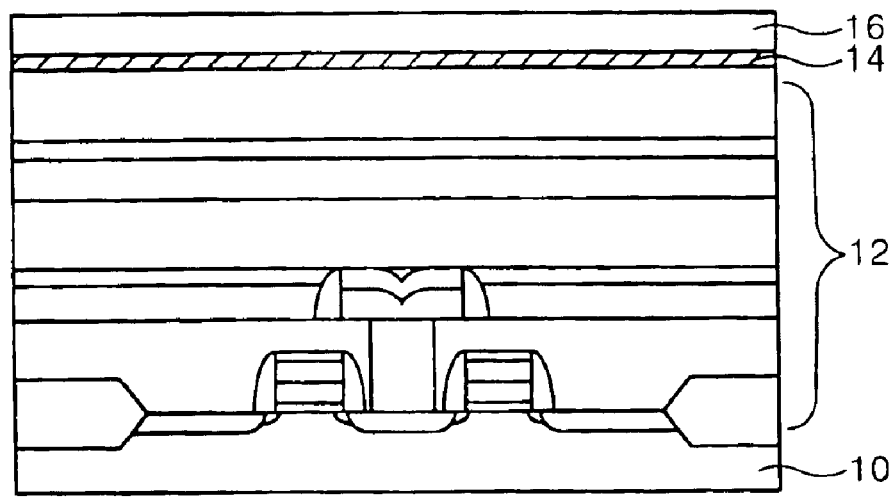
FIGS. 3a through 3d are cross-sectional diagrams illustrating a method for manufacturing capacitor of semiconductor device in accordance with the present invention.
Figure 3B:
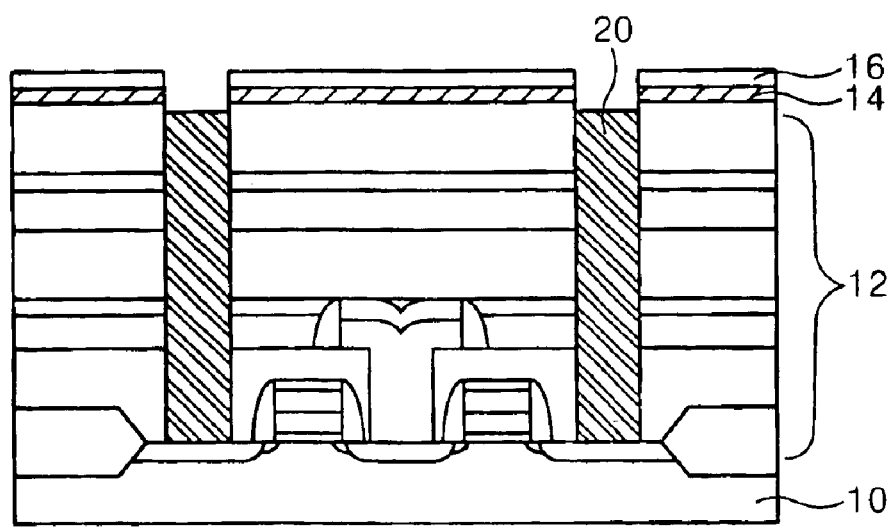
Figure 3C:
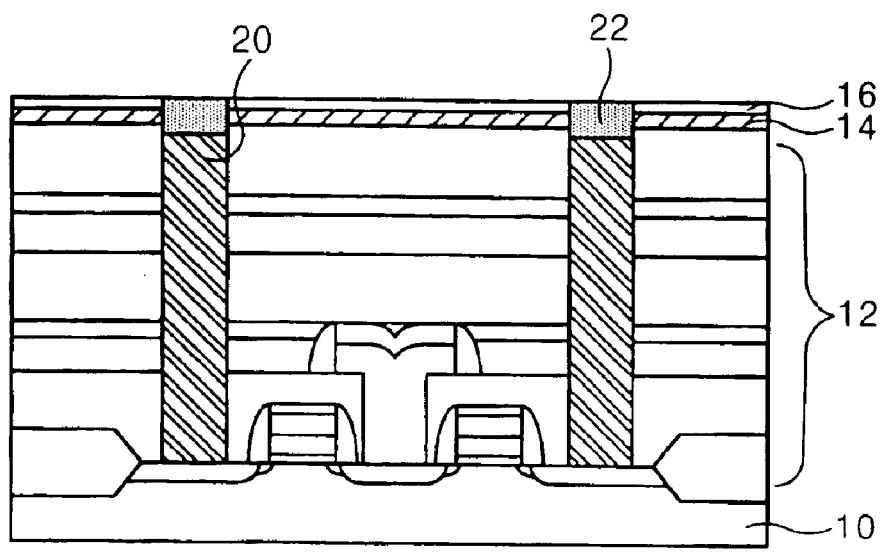
Figure 3D:
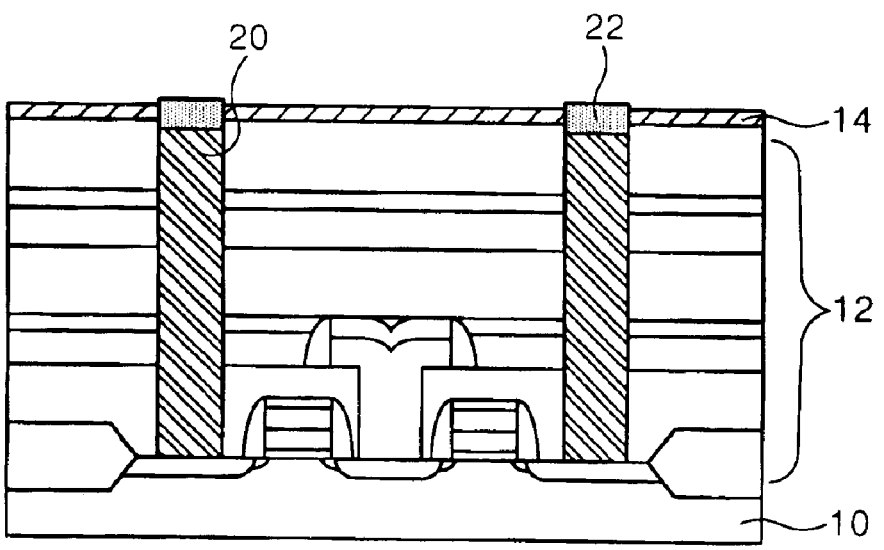

FIGS. 3a and 3d are cross-sectional diagrams illustrating a method for manufacturing capacitor of semiconductor device in accordance with the present invention.

Referring to FIG. 3a, a planarized interlayer insulating film 12 is formed on a semiconductor substrate 10 having lower structures such a word line (not shown), a bit line (not shown) and a source/drain region (not shown). It is preferable that the interlayer insulating film 12 is planarized via CMP process using a slurry including silica. Thereafter, a bonding layer 14 and a hard mask layer 16 are sequentially formed on the interlayer insulating film 12. The hard mask layer 16 preferably comprises a plasma induced silicon nitride film, a low pressure silicon nitride film, a nitric oxide film or a tantalum nitride film, each having a thickness ranging from 100 to 500 Å, in order to prevent the oxidation of layers in subsequent processes and to serve as an etch stop layer. The bonding layer 14 preferably comprises an alumina layer having a thickness ranging from 50–300 Å.

Now referring to FIG. 3b, a predetermined region for storage electrode contact region, for example a portion of the hard mask layer 16 and a portion of the interlayer insulating film 12 on the source/drain region, is removed via photolithography process using a storage electrode contact mask to form a storage electrode contact hole 18. A contact plug 20, preferably consisting of tungsten, is then formed to fill a predetermined depth of the storage electrode contact hole 18.

Referring to FIG. 3b, a barrier metal layer pattern 22 is formed in a remaining portion of the storage electrode contact hole 18 to fill up the storage electrode contact hole 18. In one embodiment, the barrier metal layer pattern 22 is formed by forming a barrier metal layer (not shown) having a thickness ranging from 1500–2000 Å consisting of TiN layer, TiAlN layer or TiSiN layer on the entire surface and then planarizing the barrier metal layer via CMP process using a acidic slurry for metal having a pH ranging from 2–6 using the hard mask layer 16 as an etch stop layer. The acidic slurry preferably comprises an oxide or an alumina abrasive. A cleaning process for removing residues using a $NH_4OH+HF$ or a SC-1 solution may be performed additionally after the CMP process.

Referring to FIG. 3d, the hard mask layer 16 is removed preferably using a phosphoric acid having a temperature ranging from 140 to 180° C.

Thereafter, a storage electrode (not shown) consisting of a noble metal layer such as an iridium layer or a platinum layer is formed on the bonding layer 14 to contact the barrier metal layer pattern 22.

Figure 4:
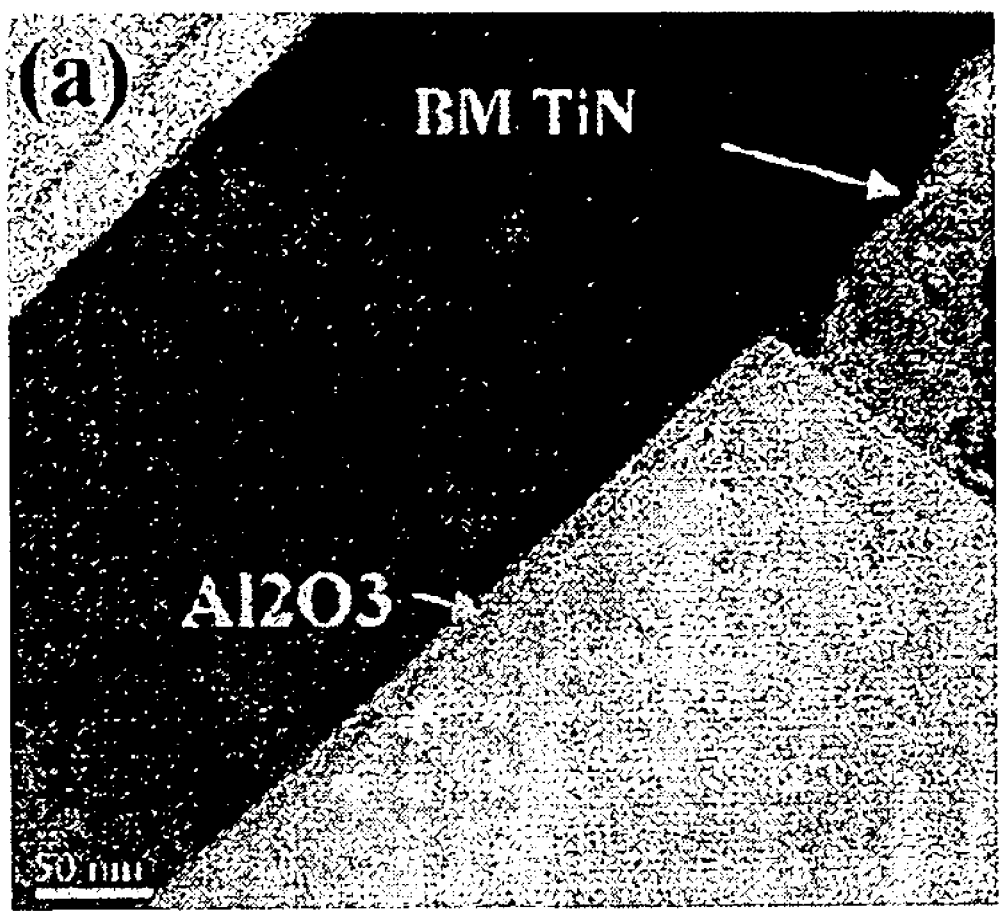
FIG. 4 a SEM photograph showing a TiN layer adjacent to a bonding layer without any oxidation thereof in accordance with the method for manufacturing capacitor of semiconductor device of the present invention.

FIG. 4 a SEM photograph showing a TiN layer adjacent to a bonding layer without any oxidation in accordance with the method for manufacturing capacitor of semiconductor device the present invention. As shown in FIG. 4, the oxidation of the barrier metal layer pattern 22 does not occur.

As discussed earlier, in accordance with the present invention, a bonding layer is exposed via etch-back process without using a mask rather than a selective etching process using a mask for opening the bonding layer, thereby preventing degradation of adhesive property due to decrease in the area of the exposed bonding layer and the oxidation of barrier metal layer.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing capacitor of semiconductor device, the method comprising the steps of:

forming an interlayer insulating film on a semiconductor substrate having a lower structure;

sequentially forming a bonding layer and a hard mask layer on the interlayer insulating film;

etching the hard mask layer, the bonding layer and the interlayer insulating film to form a storage electrode contact hole exposing a predetermined region of the semiconductor substrate for a storage electrode contact;

forming a storage electrode contact plug filling a predetermined depth of the storage electrode contact hole;

forming a barrier metal layer on the entire surface of the semiconductor substrate to fill up the storage electrode contact hole;

planarizing the barrier metal layer using the hard mask layer as an etch stop layer to form a barrier metal layer pattern;

removing the hard mask layer; and forming a storage electrode contacting the barrier metal layer pattern on the bonding layer.

2. The method according to claim 1, wherein the bonding layer comprises a alumina layer having a thickness ranging from 50–300 Å.

3. The method according to claim 1, wherein the hard mask layer comprises a film containing nitrogen and has a thickness ranging from 100 to 500 Å.

4. The method according to claim 3, wherein the film containing nitrogen is a film selected from the group consisting of a plasma induced silicon nitride film, a low pressure silicon nitride film, a nitric oxide film and a tantalum nitride film.

5. The method according to claim 1, wherein the barrier metal layer is selected from the group consisting of TiN layer, TiAlN layer and TiSiN layer having a thickness ranging from 1500–2000 Å.

6. The method according to claim 1, wherein the step of planarizing the barrier metal layer comprises a CMP process using an acidic slurry containing an oxide or an alumina abrasive and having a pH ranging from 2–6.

7. The method according to claim 6, wherein the step of removing the hard mask layer is performed using a phosphoric acid having a temperature ranging from 140 to 180° C.

8. The method according to claim 1, wherein the storage electrode comprises an iridium layer or a platinum layer.

* * * * *